United States Patent [19]
Castel

[11] Patent Number: 4,502,040
[45] Date of Patent: Feb. 26, 1985

[54] KEYBOARD HAVING KEYS ACTIVATED BY ELECTRICAL CONTACTS AND THE CAPACITY TO READ ONE STATE FROM AMONG FOUR POSSIBLE STATES

[75] Inventor: Michel Castel, Fenouillet, France

[73] Assignee: Renix Electronique, Toulouse Cedex, France

[21] Appl. No.: 391,291

[22] Filed: Jun. 23, 1982

[30] Foreign Application Priority Data

Jun. 23, 1981 [FR] France ............ 81 12338

[51] Int. Cl.³ .............................. G06F 3/02
[52] U.S. Cl. ..................... 340/365 R; 340/825.59; 340/365 S; 178/17 C
[58] Field of Search ........... 340/365 R, 365 S, 825.98, 340/825.59; 178/17 C; 179/90 K, 17 A

[56] References Cited
U.S. PATENT DOCUMENTS 3,216,008  11/1965  Goldhammer ............ 340/365 R
3,278,687  10/1966  Everett ................... 179/17 A
3,296,383  1/1967   Herter .................... 179/90 K
3,382,322  5/1968   Duerden ................. 179/17 A
3,508,013  4/1970   Monin .................... 179/90 K
3,557,311  1/1971   Goldstein ............... 179/90 K
3,855,420  12/1974  Steidl .................... 179/17 A

FOREIGN PATENT DOCUMENTS 157455  8/1971  Fed. Rep. of Germany .
997298  1/1952  France .

OTHER PUBLICATIONS

Electronic Engineering, vol. 50, No. 609, Jul., 1978, Concannon: "Cheap Multiple Functions via Post Office Lines", pp. 33, 34.

Primary Examiner—James J. Groody
Attorney, Agent, or Firm—Oblon, Fisher, Spivak, McClelland & Maier

[57] ABSTRACT

A keyboard having keys activated by electrical contacts and the capacity to read one state from among four possible states, wherein the keyboard is a dipole disposed between two terminals between which are positioned in parallel three connectors, each including one of the electrical contacts, two of these connectors including diodes mounted anode to cathode, in such a way that the various states may be discriminated by means of the successive application of two reverse electrical voltages (V1, V2) to the terminals of the dipole and the corresponding detection of the logic states of the contacts using a logic detector.

3 Claims, 3 Drawing Figures

FIG.3

|   |   | B₀ | A₀ | X | Y |
|---|---|----|----|---|---|
| 0 | 1 | 1 | 0 | 1 | 0 |
|   | 2 | 0 | 1 | 0 | 1 |
| I | 1 | 1 | 0 | 1 | 1 |
|   | 2 | 0 | 1 | 1 | 1 |
| II | 1 | 1 | 0 | 1 | 1 |
|   | 2 | 0 | 1 | 0 | 1 |
| III | 1 | 1 | 0 | 1 | 0 |
|   | 2 | 0 | 1 | 1 | 1 |

4,502,040

KEYBOARD HAVING KEYS ACTIVATED BY ELECTRICAL CONTACTS AND THE CAPACITY TO READ ONE STATE FROM AMONG FOUR POSSIBLE STATES

BACKGROUND OF THE INVENTION

1. Field of the Invention

This invention relates to keyboards having keys activated by electrical contacts, designed to provide for various commands depending on the state of the keys selected by the operator.

2. Summary of the Invention

Accordingly, it is the object of this invention to provide a novel keyboard with four possible states, employing a particularly simple electrical circuit, in dipole form, enabling simple individual reading of the four possible states.

Esssentially, this object and others are achieved according to the invention, the keyboard having keys activated by electrical contacts and the capacity to read one state from among four possible states, in which the keyboard is a dipole between the terminals of which three connectors are mounted in parallel, each including one of the electrical contacts, wherein two of these connectors are formed by diodes connected anode to cathode, whereby the various states may be discriminated by the successive application of two reverse electrical voltages to the terminals of the dipole and by means of corresponding logic detector.

In addition to its simple two-wire connection wiring, the keyboard of the invention advantageously employing only passive components, and lends itself to logic reading using simple components (such as selective current application transistors and logic state detection resistors) while, through its read element, it can tolerate relatively high parasitic resistance internal to the keyboard.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a table showing the various logic states corresponding to the four possible keyboard states in the case illustrated in FIG. 2.

DESCRIPTION OF THE PREFERRED EMBODIMENTS

Figure 1:
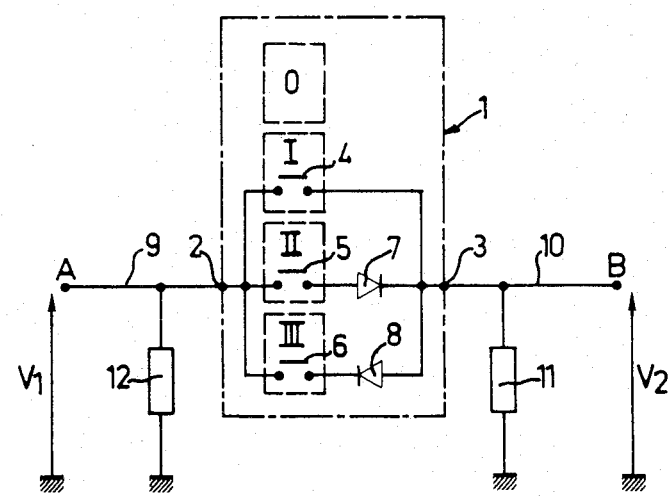
FIG. 1 is a schematic circuit diagram of a keyboard of the invention and its read mechanisms.

Referring now to the drawings, wherein like reference numerals designate identical or corresponding parts throughout the several views, and more particularly to FIG. 1 thereof, the keyboard therein diagrammed is designated generally by the designation "1" and is a dipole keyboard with two terminals (2 and 3), between which are installed three connectors in parallel, each comprising an electrical contact, the opening and closing of which is selectively activated by the diagrammed keys designated by I, II, III.

On two of these internal connectors two diodes (7, 8), connected anode to cathode, are also provided.

It can be seen that such a keyboard will therefore display four separate states:

State 0: no contact closed;
State I: key I depressed, corresponding contact 4 closed;
State II: key II depressed, corresponding contact 5 closed;
State III: key III depressed, corresponding contact 6 closed.

The keys may be arranged in a conventional manner outside the scope of the invention, in such a way that depressing a single key at a time causes the recall of any other key previously depressed, with the depressed key being released by depressing the key an additional time. The keyboard arrangement may also include, as diagrammed, a selection of four keys that can be depressed only once, in this instance, the key marked "0", whose sole function is to recall any of the other I, II, III keys that were previously depressed.

Reading the keyboard states is accomplished by successively and separately applying two reverse electrical voltages to the terminals (2 and 3) of the keyboard, generated respectively by voltages V1 and V2 applied at A and B to conductors 9, 10 which are connected to terminals 2 and 3, the states of the flow of current being displayed or detected using resistors 11, 12, connected in parallel to the mass relative to the sources of application of positive voltage V1 and V2.

If the voltage reading at one of the terminals of the keyboard is calld $V^*1$, $V^*2$, here at A or B, when the other is placed under positive voltage, four distinct pairs of logic states representative of the keyboard state are obtained, or:

$(V^*2, V^*1) = (0,0)$ State 0 (no current flow)
$(V^*2, V^*1) = (1,1)$ State I (bidirectional current flow)
$(V^*2, V^*1) = (1,0)$ State II (unidirectional current from A toward B)
$(V^*2, V^*1) = (0,1)$ State III (unidirectional current from B toward A)

Figure 2:
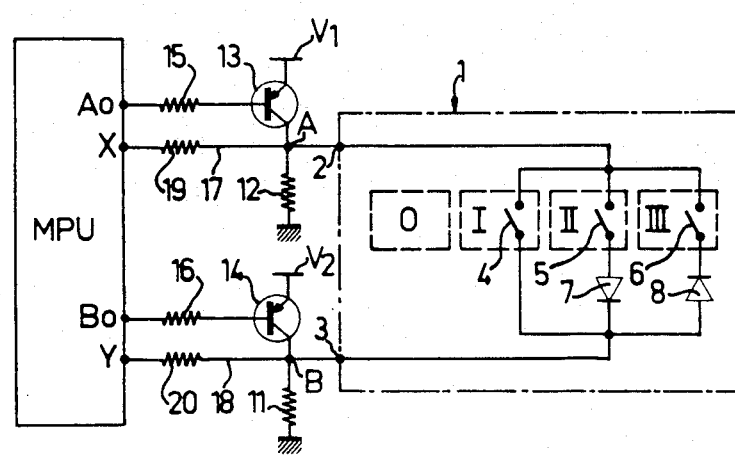
FIG. 2 is a schematic circuit diagram of such a keyboard with a read device using a microprocessor.

One example of a mode of keyboard reading by a logic system using a microprocessor (MPU) is shown in FIG. 2, wherein the same reference numbers as in FIG. 1 are employed for equivalent parts.

Mechanisms for selective voltage application to the keyboard terminal are composed of transistors (13, 14), the bases of which are connected through bias resistors (15, 16) to corresponding outputs (Ao, Bo) of the microprocessor.

Selective reading of voltages at points A, B is provided through conductors (17, 18) which connect these points, by interposition of current limiting resistors (19, 20), at read inputs X and Y of the microprocessor.

FIG. 3 provides the table of the various logic states, according to the four states (0, I, II, III) of the keyboard, and according to the two phases of the read sequence of each possible keyboard state. It should be noted that the keyboard states may be discriminated in X and Y by a program of selective voltage and read application leading to simultaneous and alternate activation of the AoY and BoX input-output pairs of the microprocessor, which amounts to reading, for each state, the logic pairs circled in broken lines in the "state" boxes X, Y, and corresponding to those already indicated in FIG. 2.

Obviously, numerous modifications and variations of the present invention are possible in light of the above teachings. It is therefore to be understood that within the scope of the appended claims, the invention may be practiced otherwise than as specifically describe herein.

What is claimed as new and desired to be secured by Letters Patent of the United States is:

1. A keyboard comprising:

plural keys each having respective electrical contacts;

a pair of terminals between which at least a group of three of said contacts are positioned, said group of three contacts disposed in parallel and including respective connectors to said terminals, wherein said group of three contacts comprises a first contact having short-circuit connectors to said pair of terminals, a second contact connected in series with a first diode between said pair of terminals, and a third contact connected in series with a second diode between said pair of terminals, said first and second diodes connected with opposite polarity relative to said pair of terminals;

means for successively applying reverse voltages to said terminals; and a logic detector for reading the states of said contacts upon successive application of said reverse voltages to determine which if any of said keys are depressed.

2. A keyboard as claimed in claim 1, wherein said detector comprises:

resistors connected in parallel relative to the means for successively applying said reverse voltages.

3. A device as claimed in claims 1 or 2, comprising:

a microprocessor having two outputs (Ao, Bo) which interact with the means for successively applying said reverse voltages, and two inputs (X, Y) respectively connected to the terminals of the keyboard to detect said corresponding logic states.

* * * * *